NON-SATURATING JUNCTION-TRANSISTOR CIRCUITS

Filed May 28, 1956

INVENTORS: R. R. BLAIR
J. R. HARRIS
BY R. B. Ardis
ATTORNEY

United States Patent Office 2,887,542

Patented May 19, 1959

2,887,542

NON-SATURATING JUNCTION-TRANSISTOR CIRCUITS

Royer R. Blair, Berkeley Heights, and James R. Harris, Morristown, N.J., assignors to Bell Telephone Laboratories, Incorporated, New York, N.Y., a corporation of New York Application May 28, 1956, Serial No. 587,888

11 Claims. (Cl. 179—171)

This invention relates generally to transistor circuits and more particularly to junction transistor pulse amplifier and switching circuits of the common-emitter configuration.

A principal object of the invention is to reduce the turn-off times of common-emitter junction transistor pulse amplifier and switching circuits.

Another and more particular object is to prevent collector current saturation in common-emitter junction transistor pulse amplifier and switching circuits.

Still another object is to prevent collector current saturation in common-emitter junction transistor pulse amplifier and switching circuits without either causing undesirably high currents to flow in the transistors and their associated circuitry or substantially reducing the available gain.

A junction transistor in a common-emitter pulse amplifier or switching circuit is considered to have reached saturation when its collector-to-emitter voltage has dropped to so low a level that it decreases only slightly in response to further increases in forward base driving potential. Unless saturation is avoided when such a transistor is in its low impedance or "on" condition, carrier storage effects introduce an appreciable time lag between removal or reversal of the base driving potential and return of the transistor to its high impedance or "off" condition. While saturation may be avoided by preventing the direct potential of the collector electrode from falling below a predetermined level, past efforts to achieve such a result have often either produced undesirably large currents in the collector-emitter path of the transistor and in associated diodes or reduced the gain of the circuit to an undesirable extent.

In accordance with the present invention, the disadvantages of the prior art are overcome and collector current saturation is prevented in a common-emitter junction transistor pulse amplifier or switching circuit by means of a diode and at least one transistor circuit of the common-collector (sometimes called emitter follower) configuration connected to prevent the direct potential between the collector and base electrodes of the common-emitter stage from falling below a predetermined value. That level is fixed by the potential drop in the base-emitter path of the common-collector stage and is made sufficiently great to keep the common-emitter stage out of saturation at all times. If the drop in the internal base-emitter path of the common-collector stage does not fix a sufficiently high minimum collector-to-base potential in the common-emitter stage by itself, it is, in accordance with an important feature of the invention, supplemented with additional resistance in the external emitter circuit of the common-collector stage or with one or more additional common-collector stages cascaded with the first. Excessive currents through the transistors and their associated circuits are avoided at all times, however, and there is no undesirable reduction in the gain provided for signals which are below the amplitude level tending to cause saturation.

In one principal embodiment, the invention takes the form of a junction transistor pulse amplifier or switching circuit which includes an input stage of the common-emitter configuration, an output stage of the common-collector configuration, a direct signal coupling between the collector electrode of the common-emitter stage and the base electrode of the common-collector stage, and a diode forming another D.-C. path between the base electrode of the common-emitter stage and the emitter electrode of the common-collector stage. As long as the input signal applied to the common-emitter stage remains below a critical level in amplitude, the collector-to-base potential of the common-emitter stage is greater than the drop in the base-emitter path of the common-collector stage and the diode remains reverse biased. When the signal rises above that level, however, the collector-to-base potential of the common-emitter stage falls below the drop in the base-emitter path of the common-collector stage. The diode then becomes forward biased and the excess signal current is by-passed around the common-emitter stage to the emitter electrode of the common-collector stage.

In another important embodiment, the invention takes the form of a junction transistor pulse amplifier or switching circuit which includes an input stage of the common-collector configuration, an output stage of the common-emitter configuration, a direct signal coupling between the emitter electrode of the common-collector stage and the base electrode of the common-emitter stage, and a diode forming another D.-C. path between the base electrode of the common-collector stage and the collector electrode of the common-emitter stage. Operation is much the same as in the previously described embodiment, except that the input signal is applied to the common-collector stage instead of directly to the common-emitter stage. Collector current saturation in the common-emitter stage is prevented by the action of the diode in by-passing signal currents in excess of the critical level around both stages directly to the collector electrode of the common-emitter stage.

Additional objects and features of the invention will be apparent upon an examination of the following detailed description of several specific embodiments. In the drawings.

Figure 1:
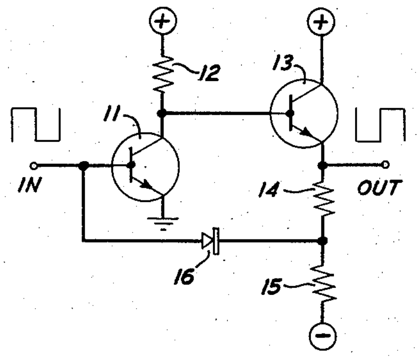
Fig. 1 illustrates an embodiment of the invention in which a common-emitter input stage is followed by a common-collector output stage.

The embodiment of the invention illustrated in Fig. 1 includes a first junction transistor having its base electrode connected as a signal input electrode, its emitter electrode grounded, and its collector electrode connected through a resistor 12 to a source of positive potential. In the conventional symbol used for transistor 11, the emitter arrow points away from the base, indicating an n-p-n transistor, in which positive emitter current flows out of and forward base driving current flows into the transistor. All of the transistors in this and succeeding figures are, for convenience, shown as n-p-n transistors. Transistors of the p-n-p type, in which positive emitter current flows into and forward base driving current flows out of the transistor, may be used if desired if diode and D.-C. source polarities are reversed from those shown.

Transistor 11 in Fig. 1 is connected as a common-emitter stage, with the collector electrode serving as the output electrode of the stage. In the past, collector current saturation in such a circuit would most like have been combatted either by returning a diode from the collector electrode to a fixed positive potential or by inserting a fairly large resistance in series with the base electrode. While both arrangements would most likely keep transistor 11 out of saturation, the first suffers the disadvantage that relatively large currents tend to flow through both the diode and the collector-emitter path of the transistor. Even if the diode does not burn out as a result of the heavy currents, the arrangement is disadvantageous from the standpoints of transistor and diode life and of power conversion efficiency. The second arrangement does not suffer from these disadvantages but, instead, tends to have greatly reduced gain even for signal amplitudes which do not drive the transistor into saturation.

In the embodiment of the invention shown in Fig. 1, these disadvantages are overcome with the aid of a circuit arrangement which includes a second transistor 13. The collector electrode of transistor 11 is connected directly to the base electrode of transistor 13 and the collector electrode of the latter transistor is connected to the positive D.-C. source supplying the collector electrode of transistor 11. The emitter electrode of transistor 13 is connected as a signal output terminal and is also connected through a pair of series resistors 14 and 15 to a source of negative potential. Transistor 13 is thus connected as a common-collector (sometimes called emitter follower) stage, which is much less susceptible of collector current saturation than is the common-emitter stage. The stage, it will be noted, can be classified as common collector for the reason that its signal input circuit encompasses both base and collector electrodes while its signal output circuit encompasses both emitter and collector electrodes. The load, however, is connected directly to the emitter electrode, which follows the base in potential in much the same manner that the cathode of a vacuum tube cathode follower follows the potential of the control grid. The stage may, therefore, also be classified as an emitter-follower stage.

The remainder of the circuit featured by the invention comprises a diode 16 connected between the base electrode of transistor 11 and the junction between resistors 14 and 15. Diode 16 is poled for easy current flow toward resistors 14 and 15. The polarity of diode 16, it will be noted, may also be described as that by-passing forward base driving current from transistor 11 around both stages to the output circuit whenever the diode is in its conducting condition.

The embodiment of the invention illustrated in Fig. 1 may be used by itself as a pulse amplifier or switching circuit, or alternatively, as one side of a four-transistor flip-flop circuit. In the latter case, each non-saturating pair of transistors like that shown in Fig. 1 takes the place of a single transistor in a conventional flip-flop circuit, with cross-coupling between the emitter electrode of transistor 13 in one pair and the base electrode of transistor 11 in the other.

The operation of the circuit shown in Fig. 1 may best be explained if it is first assumed that a positive-going input pulse is applied to the base electrode of transistor 11 in the common-emitter stage. The forward base driving current from this signal turns transistor 11 "on" (i.e., causes its collector-emitter path to assume its low impedance condition) and the potential of the collector electrode of transistor 11 drops. As the potential of the collector electrode of transistor 11 drops, the potential of the base electrode of transistor 13 in the common-collector circuit also drops, tending to turn transistor 13 "off" (i.e., causes collector-emitter path to assume its high impedance condition). As long as the potential difference between the collector and base electrodes of transistor 11 remains greater than that between the base electrode of transistor 13 and the cathode terminal of diode 16, diode 16 is reverse biased and remains shut off, leaving the gain of the circuit unimpaired and permitting the circuit to function substantially as if diode 16 were not there.

If the forward driving potential at the base electrode of transistor 11 goes high enough, however, the collector potential of transistor 11 continues to approach the base potential and the collector current nears its saturation level. In accordance with an important feature of the invention, however, the potential drop in the base-emitter path of the common-collector stage is fixed to arrest the approach of the collector potential of transistor 11 to the base potential. The drop in the internal base-emitter path of transistor 13 is so related in magnitude to that across external emitter circuit resistance 14 that, before transistor 11 reaches saturation, the drop between the base electrode of transistor 13 and the cathode of diode 16 exceeds the drop between the collector and base electrodes of transistor 11. When that happens, diode 16 becomes forward biased and any additional forward driving current at the base electrode of transistor 11 is simply by-passed around both stages to the negative supply through resistor 15. There are no excessive currents through either transistors 11 and 13 or diode 16 and the common-emitter stage is kept out of saturation. When the forward driving potential is removed from the base electrode of transistor 11 or is reversed in polarity, the common-emitter stage is ready to switch to its high impedance or "off" condition with no delay due to carrier storage time.

Figure 2:
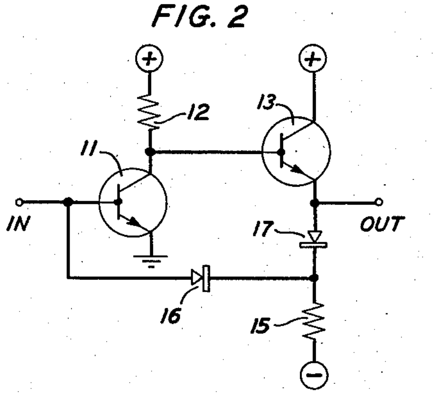
Fig. 2 shows a modification of the embodiment of Fig. 1 in which a diode having the low impedance portion of its forward conducting characteristic offset from zero potential is used to improve the accuracy of operation.

Fig. 2 shows an embodiment of the invention which is an improvement over that illustrated in Fig. 1 in that a silicon-alloy junction diode 17 is substituted for resistor 14 in the collector-emitter circuit of transistor 13 to fix somewhat more precisely the signal level at which diode 16 begins to conduct. Diode 17 is poled in the direction of positive emitter current flow in transistor 13 and has a forward conducting characteristic in which the low-impedance portion is offset from zero potential by a predetermined amount, usually of the order of 0.6 volt. Diode 17 does not, in other words, begin to conduct in its forward direction until approximately 0.6 volt of forward bias is applied. In the embodiment of the invention illustrated in Fig. 2, diode 17 is forward biased at all times since resistor 15 is returned to a negative voltage supply. The forward drop across diode 17 changes only slightly with variations in emitter current in transistor 13.

Figure 3:
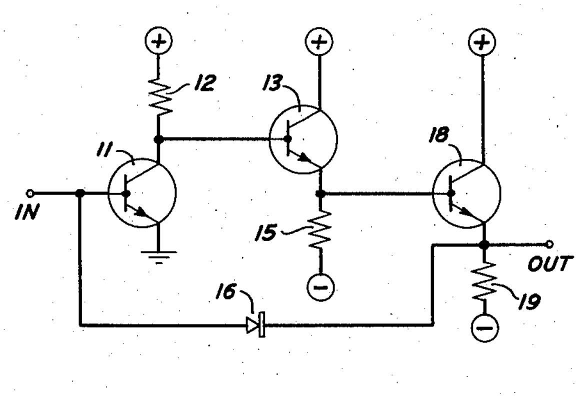
Fig. 3 illustrates an embodiment of the invention in which a common-emitter input stage is followed by a pair of cascaded common-collector stages.

Still another variation of the embodiment of the invention shown in Fig. 1 is illustrated in Fig. 3. The arrangement in Fig. 3 includes an additional common-collector stage cascaded with the first common-collector stage and is particularly advantageous whenever it is desirable to make the output impedance even lower than that provided by the arrangements of Figs. 1 and 2. In Fig. 3, the emitter electrode of transistor 13 is connected directly to the negative potential source through resistor 15 alone and is also connected directly to the base electrode of a third transistor 18. The collector electrode of transistor 18 is connected to the positive D.-C. supply source, and the emitter electrode is returned to the negative D.-C. supply source through a resistor 19. The emitter electrode of transistor 18, instead of that of transistor 13, serves as the output terminal for the circuit and diode 16, instead of being connected to the emitter electrode of transistor 13, is connected to the emitter electrode of transistor 18.

The operation of the embodiment of the invention shown in Fig. 3 is substantially the same as that of the arrangements shown in Figs. 1 and 2. An additional resistor or diode in the collector-emitter circuit of transistor 18 is generally unnecessary, and the base-emitter path of transistor 18 in effect takes the place of diode 17 in Fig. 2. If a larger voltage drop is desired between the collector electrode of transistor 11 and the cathode terminal of diode 16, additional common-collector stages can be cascaded or, alternatively, a resistor or one or more silicon or germanium alloy junction diodes can be inserted between the emitter electrode of transistor 18 and the upper end of resistor 19. Cascading additional common-collector stages, in accordance with this feature of the invention, has the advantage of reducing the output impedance of the circuit still further where that is desired and of isolating the circuit input terminal still more effectively from the output.

Figure 4:
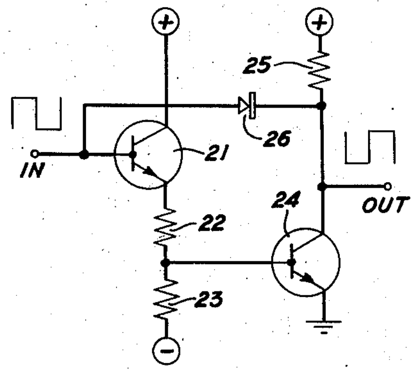
Fig. 4 depicts an embodiment of the invention in which a common-collector input stage is followed by a common-emitter output stage.

Fig. 4 of the drawings illustrates an important embodiment of the invention which is, in a sense, an inverse counterpart of those shown in Figs. 1, 2, and 3. In Fig. 4, the common-emitter stage which it is desired to keep out of saturation is the output stage of the circuit and the common-collector stage the input stage. The input stage comprises a transistor 21 having its base electrode connected as an input terminal, its collector electrode connected to a source of positive potential, and its emitter electrode returned to a source of negative potential through a pair of series resistors 22 and 23. The junction between resistors 22 and 23 is connected directly to the base electrode of a junction transistor 24. Transistor 24 forms the common-emitter stage and has its emitter electrode grounded and its collector electrode connected through a resistor 25 to the source of direct positive potential. The collector electrode of transistor 24 functions as an output terminal for the circuit as a whole and a diode 26 is connected between the base electrode of transistor 21 and the collector electrode of transistor 24. Diode 26 is poled for easy current flow from the former to the latter electrode. Like that of diode 16 in Figs. 1, 2, and 3, the polarity of diode 26 may also be described as that by-passing forward base driving current from the first stage around both stages to the output terminal whenever the diode is in its conducting condition.

The operation of the embodiment of the invention shown in Fig. 4 is generally similar to that of the embodiments which have already been described, the principal difference being that the input driving signal is applied to the base electrode of the common-collector stage rather than to that of the common-emitter stage. If the forward driving voltage at the base electrode of transistor 21 is too low to force transistor 24 into saturation, the potential drop between the collector and base electrodes of transistor 24 is greater than that between the base electrode of transistor 21 and the base electrode of transistor 24. Diode 26 then remains reverse biased, and the two-stage amplifier functions substantially as if diode 26 were not there. There is thus no unnecessary reduction in the available gain of the circuit when the signal is not strong enough to drive transistor 24 into saturation. As the input driving voltage rises above a critical point, however, the combined drop across the internal base-emitter path of transistor 21 and resistor 22 begins to exceed the drop between the collector and baes electrodes of transistor 24. At that instant, diode 26 becomes forward biased and substantially all excess forward driving current at the base electrode of transistor 21 is by-passed to the output terminal. Transistor 24 thus remains out of saturation and the combined amplifier circuit is ready to switch back to its "off" state immediately upon the removal or reversal of the signal.

Figure 5:
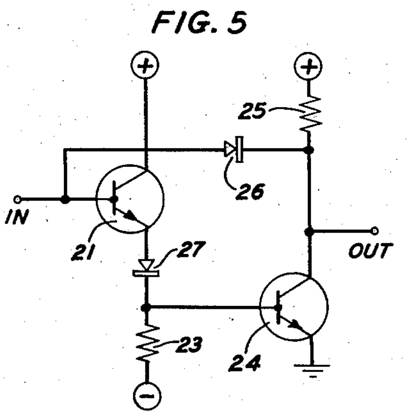
Fig. 5 shows a modification of the embodiment of Fig. 4 in which a diode having the low impedance portion of its forward conducting characteristic offset from zero potential is used to improve the accuracy of operation.

The embodiment of the invention illustrated in Fig. 5 is an improvement over that shown in Fig. 4 in the same sense that the embodiment of the invention shown in Fig. 2 is an improvement over the circuit of Fig. 1. A silicon-alloy junction diode 27 replaces resistor 22 and helps free the voltage drop between the base electrodes of transistors 21 and 24 from dependence upon the emitter current flowing in transistor 21. Diode 27 is poled in the direction of positive emitter current flow in transistor 21.

Another variation of the embodiment of the invention hown in Fig. 4 may include two or more cascaded common-collector transistor stages instead of the single common-collector stage illustrated. Such an arrangement would not only prevent collector current saturation in the common-emitter stage but would also provide a very high input impedance at the initial common-collector stage and a low output impedance at the common-emitter output stage.

It is to be understood that the above-described arrangements are illustrative of the application of the principles of the invention. Numerous other arrangements may be devised by those skilled in the art without departing from the spirit and scope of the invention.

What is claimed is:

1. An amplifier which comprises a transistor stage of the common-emitter configuration, the transistor in said common-emitter stage having at least emitter, collector, and base electrodes, and means to prevent collector current saturation in said common-emitter stage which comprises at least one transistor stage of the common-collector configuration, the transistor in said common-collector stage having at least emitter, collector, and base electrodes, a first D.-C. path interconnecting the collector electrode of said common-emitter stage and the base electrode of said common-collector stage, a second D.-C. path interconnecting the emitter electrode of said common-collector stage and the base electrode of said common-emitter stage, and an asymmetrically conducting device connected in one of said D.-C. paths to prevent the direct potential between the collector and base electrodes of said common-emitter stage from falling below a predetermined level, said asymmetrically conducting device being poled to by-pass forward base driving current around the input one of said stages whenever said direct potential tends to fall below said predetermined level.

2. An amplifier which comprises a transistor stage of the common-emitter configuration, the transistor in said common-emitter stage having at least emitter, collector, and base electrodes, means to supply an input signal to the base electrode of said common-emitter stage, means to prevent collector-current saturation in said common-emitter stage due to excessive signal amplitudes which comprises a transistor stage of the common-collector configuration, the transistor in said common-collector stage having at least emitter, collector, and base electrodes, a first D.-C. path interconnecting the collector electrode of said common-emitter stage and the base electrode of said common-collector stage, a second D.-C. path interconnecting the base electrode of said common-emitter stage and the emitter electrode of said common-collector stage, and an asymmetrically conducting device connected in said second D.-C. path to prevent the direct potential between the collector and base electrodes of said common-emitter stage from falling below a predetermined level, said asymmetrically conducting device being poled to by-pass forward base driving current around said common-emitter stage whenever said direct potential tends to fall below said predetermined level, and means to withdraw output signal energy from the emitter electrode of said common-collector stage.

3. An amplifier in accordance with claim 2 which includes at least one diode having a forward conducting characteristic in which the low impedance portion is offset from zero potential by a predetermined amount, said diode being connected between the emitter electrode of said common-collector stage and said asymmetrically conducting device in the emitter-collector circuit of said common-collector stage and poled in the direction of positive emitter current flow in said common-collector stage.

4. An amplifier which comprises a transistor stage of the common-emitter configuration, the transistor in said common-emitter stage having at least emitter, collector, and base electrodes, and means to prevent collector-current saturation in said common-emitter stage which comprises a first transistor stage of the common-collector configuration, a second transistor stage of the common-collector configuration, the transistor in said common-collector stages having at least emitter, collector, and base electrodes, a first D.-C. path interconnecting the collector electrode of said common-emitter stage and the base electrode of said first common-collector stage, a second D.-C. path interconnecting the emitter electrode of said first common-collector stage and the base electrode of said second common-collector stage, a third D.-C. path interconnecting the emitter electrode of said second common-collector stage and the base electrode of said common-emitter stage, and an asymmetrically conducting device connected in one of said D.-C. paths to prevent the direct potential between the collector and base electrodes of said common-emitter stage from falling below a predetermined level, said asymmetrically conducting device being poled to by-pass forward base driving current around the input one of said stages whenever said direct potential tends to fall below said predetermined level.

5. An amplifier which comprises a transistor stage of the common-emitter configuration, the transistor in said common-emitter stage having at least emitter, collector, and base electrodes, means to supply an input signal to the base electrode of said common-emitter stage, means to prevent collector-current saturation in said common-emitter stage due to excessive signal amplitudes which comprises a first transistor stage of the common-collector configuration, a second transistor stage of the common-collector configuration, the transistors in said common-collector stages having at least emitter, collector, and base electrodes, a first D.-C. path interconnecting the collector electrode of said common-emitter stage and the base electrode of said first common-collector stage, a second D.-C. path interconnecting the emitter electrode of said first common-collector stage and the base electrode of said second common-collector stage, a third D.-C. path interconnecting the base electrode of said common-emitter stage and the emitter electrode of said second common-collector stage, and an asymmetrically conducting device connected in said third D.-C. path to prevent the direct potential between the collector and base electrodes of said common-emitter stage from falling below a predetermined level, said asymmetrically conducting device being poled to by-pass forward base driving current around said common-emitter stage whenever said direct potential tends to fall below said predetermined level, and means to withdraw output signal energy from the emitter electrode of said second common-collector stage.

6. An amplifier which comprises a transistor stage of the common-emitter configuration, the transistor in said common-emitter stage having at least emitter, collector, and base electrodes, means to withdraw output signal energy from the collector electrode of said common-emitter stage, means to prevent collector-current saturation in said common-emitter stage which comprises a transistor stage of the common-collector configuration, the transistor in said common-collector stage having at least emitter, collector, and base electrodes, a first D.-C. path interconnecting the base electrode of said common-collector stage and the collector electrode of said common-emitter stage, a second D.-C. path interconnecting the emitter electrode of said common-collector stage and the base electrode of said common-emitter stage, and an asymmetrically conducting device connected in said first D.-C. path to prevent the direct potential between the collector and base electrodes of said common-emitter stage from falling below a predetermined level, said asymmetrically conducting device being poled to bypass forward base driving current around said common-collector stage whenever said direct potential tends to fall below said predetermined level, and means to supply an input signal to the base electrode of said common-collector stage.

7. An amplifier in accordance with claim 6 which includes at least one diode having a forward conducting characteristic in which the low impedance portion is offset from zero potential by a predetermined amount, said diode being connected between the emitter electrode of said common-collector stage and the base electrode of said common-emitter stage in the emitter-collector circuit of said common-collector stage and poled in the direction of positive emitter current flow in said common-collector stage.

8. An amplifier which comprises a first transistor having an emitter electrode, a collector electrode, and a base electrode, a signal input path interconnecting the base and emitter electrodes of said first transistor, means to prevent collector current saturation in said first transistor which comprises a second transistor having an emitter electrode, a collector electrode, and a base electrode, a D.-C. interstage circuit interconnecting the collector electrode of said first transistor and the base electrode of said second transistor and interconnecting the emitter electrode of said first transistor and the collector electrode of said second transistor, and an asymmetrically conducting device connected between the base electrode of said first transistor and the emitter electrode of said second transistor and poled to bypass forward base driving current around said first transistor whenever the direct potential between its collector and base electrodes tends to fall below a predetermined level, means to supply direct operating potentials to both of said transistors, and a signal output path interconnecting the emitter and collector electrodes of said second transistor.

9. An amplifier in accordance with claim 8 which includes at least one diode having a forward conducting characteristic in which the low impedance portion is offset from zero potential by a predetermined amount, said diode being connected in said signal output path between the emitter electrode of said second transistor and said asymmetrically conducting device and poled in the direction of forward emitter current flow in said second transistor.

10. An amplifier which comprises a first transistor having an emitter electrode, a collector electrode, and a base electrode, a signal output path interconnecting the collector and emitter electrodes of said first transistor, means to prevent collector current saturation in said first transistor which comprises a second transistor having an emitter electrode, a collector electrode, and a base electrode, a D.-C. interstage circuit interconnecting the emitter electrode of said second transistor and the base electrode of said first transistor and interconnecting the collector electrode of said second transistor and the emitter electrode of said first transistor, and an asymmetrically conducting device connected between the base electrode of said second transistor and the collector electrode of said first transistor and poled to bypass forward base driving current around said second transistor whenever the direct potential between the collector and base electrodes of said first transistor tends to fall below a predetermined level, means to supply direct operating potentials to both of said transsistors, and a signal input path interconnecting the base and collector electodes of said second transistor.

11. An amplifier in accordance with claim 10 which includes at least one diode having a forward conducting characteristic in which the low impedance portion is offset from zero potential by a predetermined amount, said diode being connected between the emitter electrode of said second transistor and the base electrode of said first transistor and poled in the direction of forward emitter current flow in said second transistor.

References Cited in the file of this patent

UNITED STATES PATENTS

| | | |
|---|---|---|
| 2,655,609 | Shockley | Oct. 13, 1953 |
| 2,759,142 | Hamilton | Aug. 14, 1956 |
| 2,767,365 | Guggi | Oct. 16, 1956 |